United States Patent [19]
Shiah et al.

[11] Patent Number: 6,101,138
[45] Date of Patent: Aug. 8, 2000

[54] AREA EFFICIENT GLOBAL ROW REDUNDANCY SCHEME FOR DRAM

[75] Inventors: Chun Shiah, Taichung; Bor-Doou Rong, Chupei; Jeng-Tzong Shih; Po-Hung Chen, both of Hsinchu, all of Taiwan

[73] Assignee: Eton Technology, Inc., Hsin-Chu, Taiwan

[21] Appl. No.: 09/358,982

[22] Filed: Jul. 22, 1999

[51] Int. Cl.[7] ................................................. G11C 7/00
[52] U.S. Cl. ............................................. 365/200; 365/63
[58] Field of Search ............................. 365/200, 230.03, 365/210, 63

[56] References Cited

U.S. PATENT DOCUMENTS

| | | | |
|---|---|---|---|
| 5,325,334 | 6/1994 | Roh et al. | 365/201 |
| 5,502,676 | 3/1996 | Pelley et al. | 365/200 |
| 5,673,227 | 9/1997 | Engles et al. | 365/200 |
| 5,691,946 | 11/1997 | DeBrosse et al. | 365/200 |
| 5,732,030 | 3/1998 | Dorney | 365/200 |
| 5,764,587 | 6/1998 | Buettner et al. | 365/230.06 |
| 5,831,913 | 11/1998 | Kirihata | 365/200 |
| 5,831,914 | 11/1998 | Kirihata | 365/200 |
| 5,881,003 | 3/1999 | Kirihata et al. | 365/200 |

OTHER PUBLICATIONS

Kirihata et al., "Fault–Tolerant Designs for 256 Mb DRAM", IEEE Journal of Solid State Circuits, vol. 31, No. 4, Apr. 1996, pp. 559–566.

*Primary Examiner*—David Nelms
*Assistant Examiner*—Thong Le
*Attorney, Agent, or Firm*—George O. Saile; Stephen B. Ackerman

[57] ABSTRACT

In this invention a global row redundancy scheme for a DRAM is described which effectively uses the resources of the chip to produce an area efficient design. The DRAM is constructed from two types of memory blocks, one that has a redundant cell array and one that does not. Both memory block types contain a memory cell array and bit line sense amplifiers. The bit line sense amplifiers, contained on the block with the redundant cell array, are shared with the memory cell array also contained in the block, and thus eliminating the need for sense amplifiers for use only with the redundant cell array. Although, every block could contain a redundant cell array, only one or two blocks with the redundant cell array are normally used. In the global row redundancy scheme repair can be made to any row containing a failed memory cell located in any memory block by using any unused rows in any redundant cell array, and in doing so provides a maximum effectiveness in repairing DRAM's that provides the opportunity to maximize yield.

15 Claims, 4 Drawing Sheets

AREA EFFICIENT GLOBAL ROW REDUNDANCY SCHEME FOR DRAM

BACKGROUND OF THE INVENTION

1. Field of Invention

This invention relates to semiconductor memories and in particular to repair using a global row redundancy.

2. Description of Related Art

Traditional redundancy schemes for repairing memory chips, such as DRAM's, has included a redundancy cell array within each block of memory cells that make up the memory chip. No separate bit line sense amplifiers are required for the redundancy cell array. Sharing of redundant rows between blocks is not allowed and parts must be scrapped if a particular block runs out of rows in a redundant cell array. This has led to a redundant scheme where a redundant cell array is provided in a separate area from the memory blocks, and each memory block contains only a memory cell array and bit line sense amplifiers. Associated with the redundant cell array are additional sense amplifiers to accommodate the repair action and as a result cause an extra area to be used for the additional sense amplifiers.

In T. Kirihata et al., "Fault-Tolerant Designs for 256 Mb Dram", Kirihata et al., IEEE Journal of Solid State Circuits, Vol. 31, No. 4, April 1996, pp 559–566, a fault tolerant design is described in which redundant word lines are provided in a 128 Kb redundancy block that is separate from the sixteen one megabit blocks of the memory array. A scheme for column redundancy is also described using interchangeable MDQ's (main data input and outputs). In U.S. Pat. No. 5,881,003 (Kirihata et al.) a method for employing a new redundancy scheme is described. The variable domain redundancy replacement scheme described creates a replacement domain out of at least two variable domains which partially overlap with respect to each other. In U.S. Pat. No. 5,831,914 (Kirihata) a variable size redundancy replacement scheme is described. A plurality of variable redundancy units are provided which makes it possible to choose the most effective redundancy unit which is most closely fitting to the size of the cluster of failures that are to be replaced. In U.S. Pat. No. 5,831,913 a row redundancy replacement scheme is described using a variable size redundancy replacement circuitry. The redundancy uses separate redundant DRAM blocks with a global redundancy. In U.S. Pat. No. 5,764,587 (Buettner et al.) a word line redundancy is described where word line decoders are selectively connected to word line drivers through switches. There are more word line drivers than word line decoders which provides the necessary redundancy.

As the number of cells in memory chips have grown, there has been a need to change the way rows of redundant cells are distributed within the memory chip. An array of redundant cells need to be accessible to all memory cells to reduce the exposure to using up redundant rows in local areas before a memory chip has been repaired. The distribution of these arrays of redundant cells need to be placed within the memory chip such that extra bit line sense amplifiers are not required, saving chip surface area.

SUMMARY OF THE INVENTION

In this invention two different types of memory blocks are used to form a DRAM chip. A first block type contains a memory cell array, a redundant cell array and bit line sense amplifiers. A second block type contains a memory cell array and bit line sense amplifiers with the redundant cell array being left out of the second block type. One or more of the first block types are distributed among the second block types to form the DRAM chip. Although the target for this invention is a DRAM, other memory chips and embedded arrays using repair techniques similar to the DRAM can also be repaired using the techniques of this invention.

A row containing a failed memory cell within a block is repaired by replacing the row with the failed cell with a redundant row. The redundant row can be located in a first block type that is not the same block where the failed cell is located. The failed memory cell could be located in a first block type containing the redundant row used to repair the row containing the failed cell, or the failed memory cell could be located in a first block type not containing the redundant row used to repair the row containing the failed cell. Also the failed memory cell could be located in a in a second block type close to or remote from a first block type containing the redundant row used to repair the row containing the failed cell. A cluster of failures may be repaired using redundant rows in the same or different blocks of the first block type. The intent with the scheme of this invention is to provide flexibility in repair and maximize the opportunity to repair all failing memory cells such that any failed memory cell located in any memory block can be repaired by using any unused row in any redundant cell array.

Since bit line sense amplifiers are included in the first memory block type, no additional sense amplifiers are needed to support the redundant cell array. Thus there is no additional semiconductor area required to support the sense amplifiers as compared to a similar number of redundant cells in a traditional method where the redundant cell array is included in each memory block.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
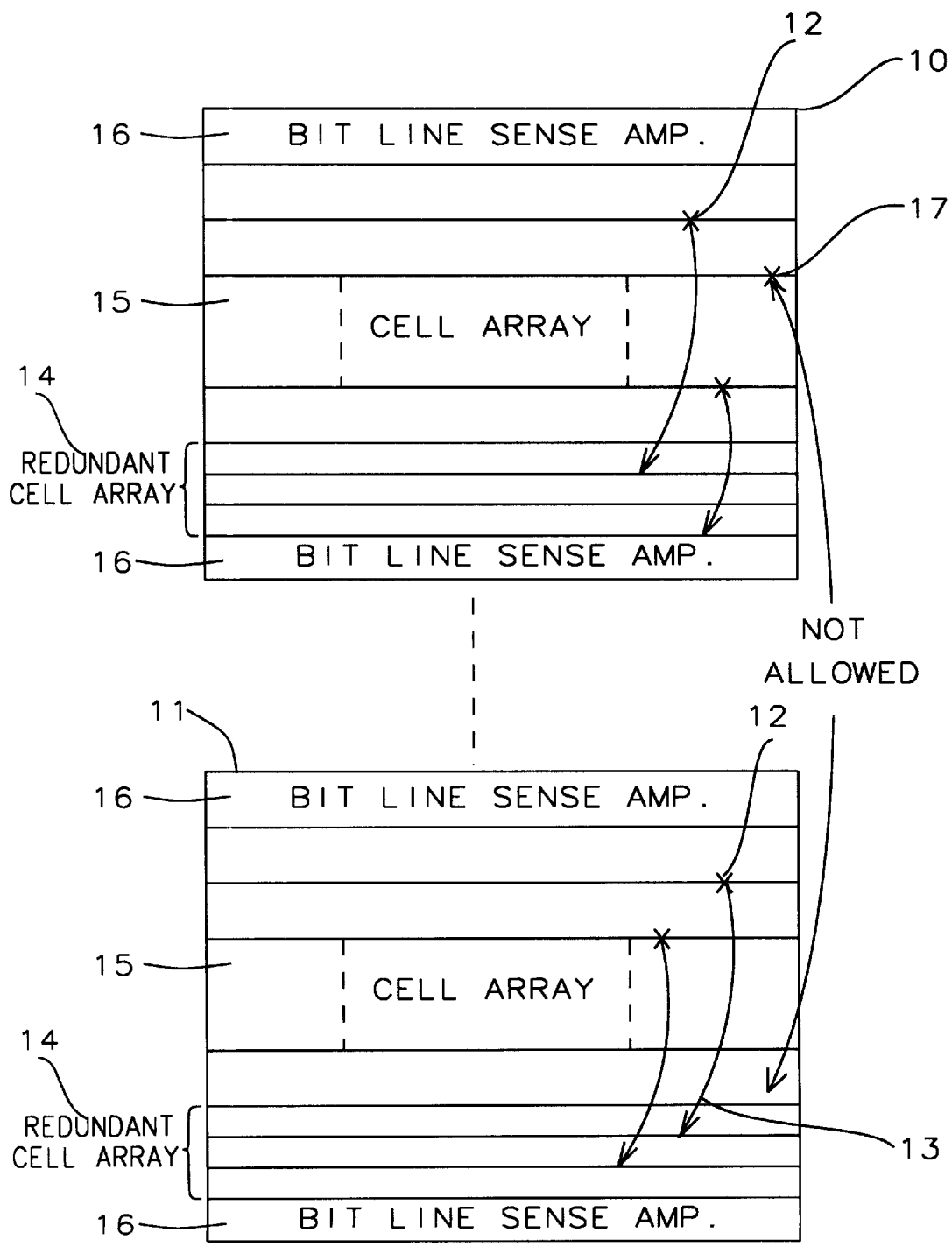
FIG. 1 is a diagram showing a memory block with a redundant cell array of prior art.

In FIG. 1 is shown a local redundancy scheme of prior art for repair of a a failed memory cell 12 of an DRAM. There are two of several memory blocks 10 and 11 shown, each with a memory cell array 15, bit line sense amplifiers 16 and a redundant cell array 14. A failed cell 12 is denoted by an "X" on a word line of the cell array 15, and the pointer with an arrow 13 denotes that the failed cell is repaired by replacing it with a particular row in the redundant cell array 14. There is no global means in this redundancy scheme and failed cell 17 cannot be repaired using a row in the redundant cell array of memory block 11; therefore, if the rows of a redundant cell array are used up in a memory block 10 or 11, a failed cell 17 will not be able to be repaired and the memory chip will be scrapped.

Figure 2:
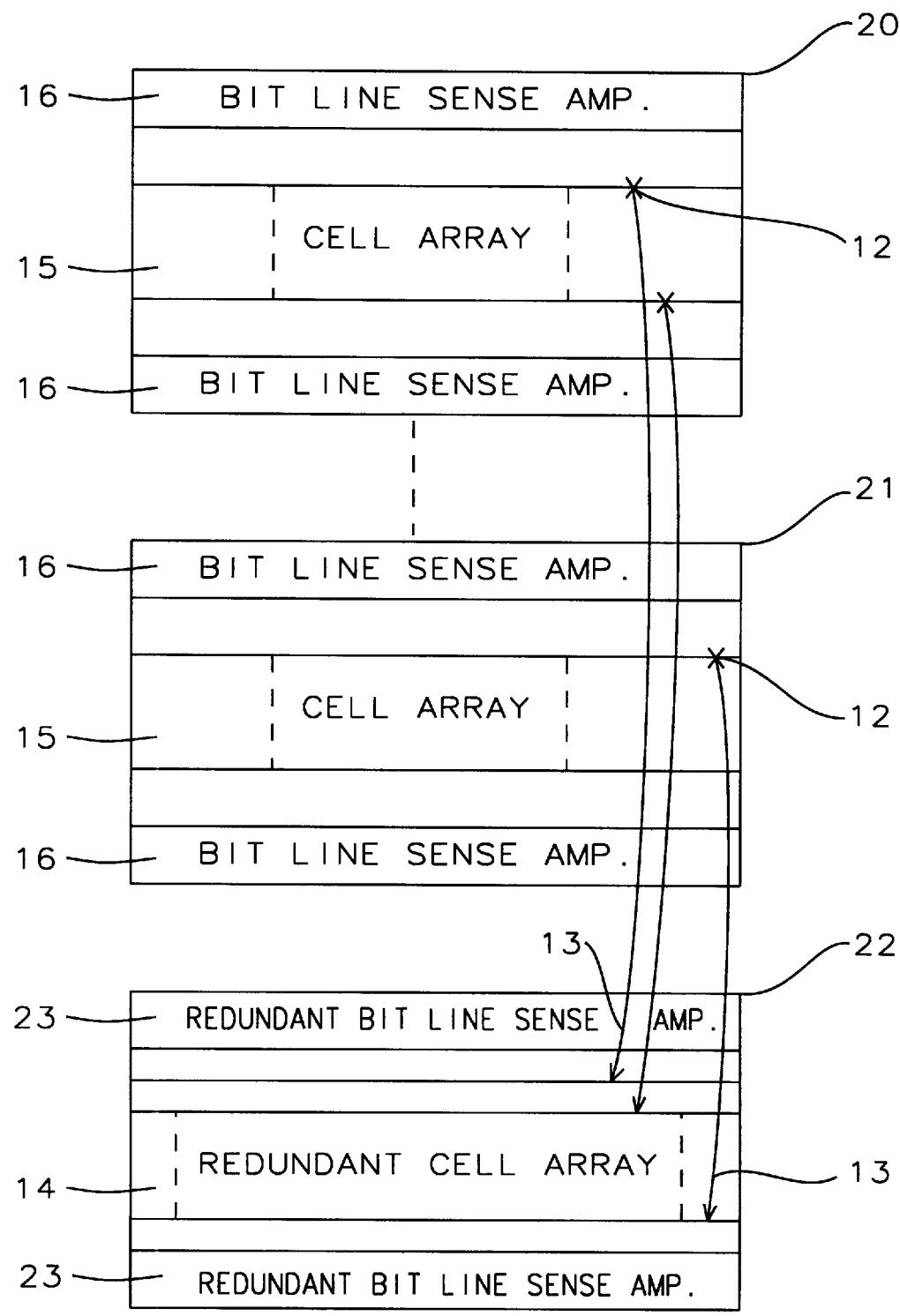
FIG. 2 is a diagram showing memory blocks with a global redundant cell array of prior art.

In FIG. 2. is shown a global row redundancy scheme of prior art. Shown are memory blocks 20 and 21 representing the memory block that make up a DRAM. There is a global repair block 22 which supplies the repair rows for the failed cell 12 denoted by an "X" in blocks 20 and 21. Each memory block 20 and 21 contains a cell array 15 and bit line sense amplifiers 16. The global repair block 22 contains a redundant cell array 14 and bit line sense amplifiers 23. The failed memory cell 12 are repaired by selecting rows in the redundant cell array 14 in the global repair block 22 as indicated by the pointer with an arrow 13. In this scheme if a memory has a high demand on repair and other blocks have a lower demand, there is opportunity to satisfy the repair need because of the sharing of the redundant cell array 14. However, there is an increase in semiconductor area to support the added bit line sense amplifiers 23 to support this global repair scheme.

Figure 3:
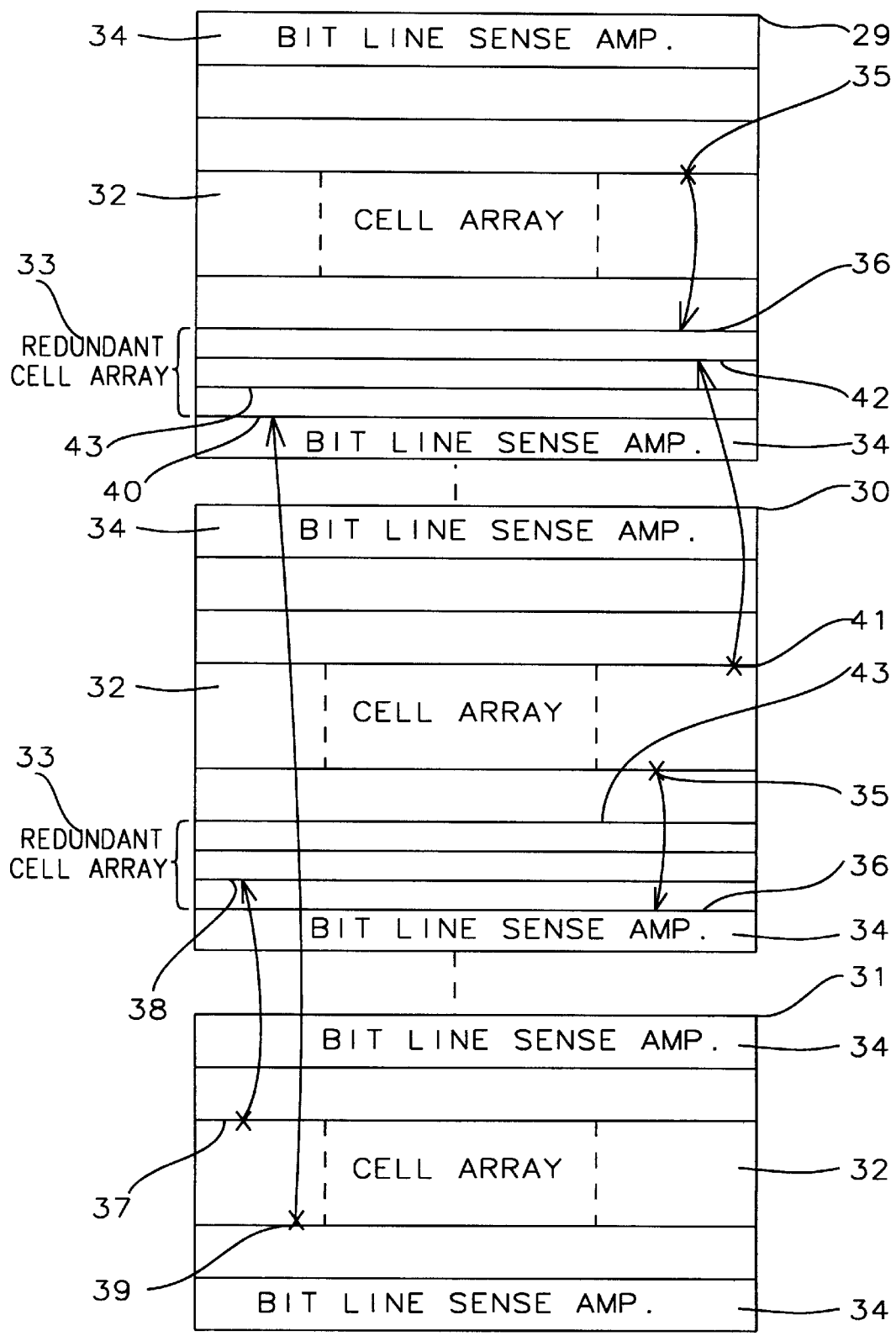
FIG. 3 is a diagram showing the global row redundancy scheme of this invention.

In FIG. 3 is shown the global row redundancy scheme of this invention. There are shown three of many memory blocks 29, 30 and 31. Two first type memory blocks 29 and 30 contains a memory cell array 32, a redundant cell array 33 and bit line sense amplifiers 34. There are one or more of these first type memory blocks 29 and 30 in the DRAM that contains them. A second type memory block 31 contains a cell array 32 and bit line sense amplifiers 34. The number of these second type memory blocks 31 is equal to the total number of blocks required for the memory minus the number of first type memory blocks used. It is possible that the entire memory could be constructed from the first type memory block 29 and 30, but more control circuits would be required. In general a DRAM chip would be constructed of a small number of the first type memory blocks 29 and 30 and the remainder of the DRAM chip would be constructed of a larger number of the second type memory blocks 31.

As can be seen in FIG. 3, a failed memory bit 35, indicated by an "X", is repaired by a line 36 in the redundant cell array 33 contained on a first type memory block 29 and 30. A failed memory bit 37 in a second type memory block 31 is repaired by a line 38 in the redundant array 33 contained on a first type memory block 30. Similarly, a failed memory bit 39 in a second type memory block 31 is repaired by a line 40 in the redundant array 33 contained on a first type memory block 29. The repair scheme is both local and global where the local repair, 35 to 36, is done using a redundant cell array 33 on the same block 29 and 30, and where global repair, 37 to 38, 39 to 40 and 41 to 42, is done using a redundant cell array 33 on different memory blocks 29 and 30. This causes two types of memory blocks 29 or 30 and 31 to be used to construct a memory chip, but it produces a more efficient use of semiconductor real estate by sharing bit line sense amplifiers 34 contained on the same block 29 and 30 as the redundant cell array 33. All blocks 29, 30 and 31 could be constructed of the first block type 29 and 30 where the redundant cell array is included in the block. Whereas this would add additional repair flexibility and efficiency, it would increase the amount of control circuitry and add to the demand for more semiconductor real estate. The minimum number of the first type memory block 29 or 30 needed is one. Additional first memory blocks 29 or 30 may be added to satisfy a particular requirement up to and including all blocks in the DRAM. In this global redundant scheme all repair can be made to any failed memory cell 35, 37 and 39 located in any block 29, 30 and 31 by using any unused row 43 in any redundant cell array 33.

Figure 4:
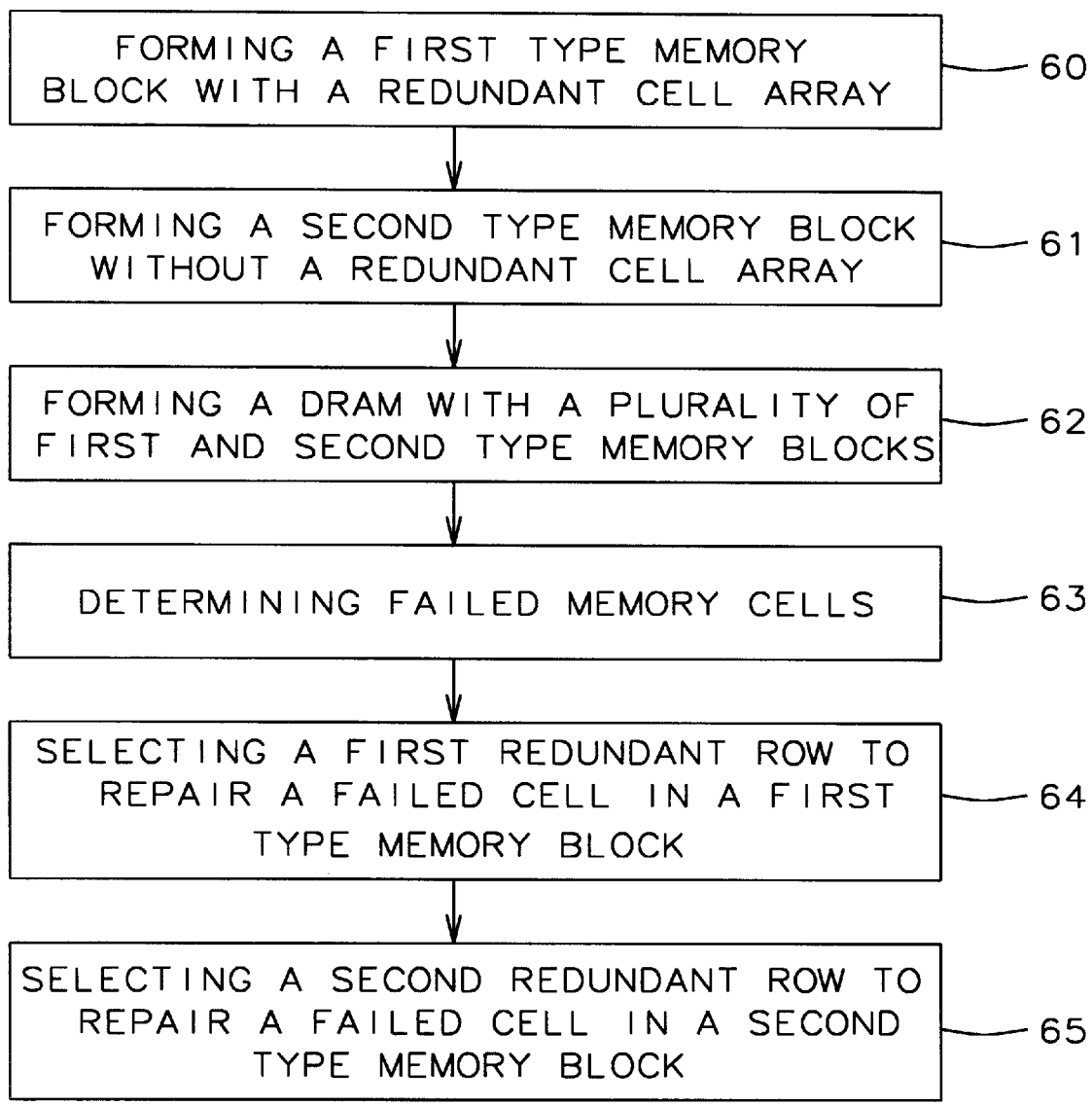
FIG. 4 is a method for forming and selecting the global row redundancy of this invention.

In FIG. 4 is shown a method of forming a global repair capability for a DRAM chip. A first type memory block containing a memory cell array and a redundant cell array is formed 60. Bit line sense amplifiers are also included in the memory block and are used in support of both the memory cell array and the redundant cell array. A second type memory block is formed containing a memory cell array and bit line sense amplifiers 61, but without a redundant cell array. A DRAM is formed with a plurality of the first type memory blocks and a plurality of second type memory blocks 62. The number of first type memory blocks can be as small as one block and as many as all the memory blocks in the DRAM. The number of second type memory blocks is equal to the total blocks in the DRAM minus the number of first type memory blocks. Thus the number of second type memory blocks can range from none to one less than the total blocks in the DRAM.

Continuing to refer to FIG. 4, once the DRAM has been formed, the failing memory cells are determined 63. This is done at the wafer level so that the failed memory cells can be repaired by replacing the rows in which the failed cells reside with rows from a redundant cell array. A first redundant row is selected to repair a row containing a failed memory cell in a first type memory block 64. Then a second redundant row is selected to repair a row containing a failed memory cell in the second type memory block 65. The process of replacing rows containing failed memory cells with rows in the redundant cell array continues until all rows with failing cells has been replaced or there are not any more rows left in the redundant cell array. If there are more than one block having a redundant cell array, the blocks with the redundant cell arrays can be used to repair rows with failing cells in each other. In this global repair scheme a repair can be done to any failed memory cell located in any memory block by using any unused rows in any redundant cell array. This provides the flexibility to maximize the repair of a particular DRAM and improve the product yield.

While the invention has been particularly shown and described with reference to preferred embodiments thereof, it will be understood by those skilled in the art that various changes in form and details may be made without departing from the spirit and scope of the invention.

What is claimed is:

1. A global row redundancy for a DRAM, comprising:
 a) a DRAM containing a first plurality of memory blocks and a second plurality of memory blocks,
 b) each memory block of said first plurality of memory blocks comprising a first memory cell array, a redundant cell array and a first set of bit line sense amplifiers,
 c) each memory block of said second plurality of memory blocks comprising a second memory cell array and a second set of bit line sense amplifiers,
 d) said first memory cell array and said second memory cell array repaired using rows in said redundant cell array contained within said first plurality of memory blocks.

2. The global row redundancy of claim 1, wherein said first memory cell array of said first plurality of memory blocks is repaired using rows contained within said redundant cell array of a first memory block of said first plurality of memory blocks.

3. The global row redundancy of claim 2, wherein said first memory cell array of said first plurality of memory blocks is repaired using rows contained within said redundant cell array of a second memory block of said first plurality of memory blocks.

4. The global row redundancy of claim 1, wherein said second memory cell array of said second plurality of memory blocks is repaired using rows contained within said redundant cell array of said first plurality of memory blocks.

5. The global row redundancy of claim 1, wherein said DRAM contains only the first plurality of memory blocks.

6. The global row redundancy of claim 1, wherein said first memory cell array and said second memory cell array are repaired using rows in any redundant cell array.

7. The global row redundancy of claim 1, wherein said first set of bit line sense amplifiers contained within said first plurality of memory blocks provides for data input and output for a repair using said redundant cell array.

8. The global row redundancy of claim 1, wherein other memory chip technologies configured with a global row redundancy can use said global row redundancy for repairing failed memory cells.

9. A method of repair selection using a global row redundancy, comprising:
   a) forming a first type memory block comprising a first memory cell array, a redundant cell array and a first set of bit line sense amplifiers,
   b) forming a second type memory block comprising a second memory cell array and a second set of bit line sense amplifiers,
   c) forming a DRAM with a plurality of said first type memory blocks and a plurality of said second type memory blocks,
   d) determining failed memory cells in said plurality of said first type memory blocks and in said plurality of said second type memory blocks
   e) selecting a first redundant row in said redundant cell array to repair a failed cell in said first memory cell array of said first type memory block,
   f) selecting a second redundant row in said redundant cell array to repair said failed cell in said second memory cell array of said second type memory block.

10. The method of claim 9, wherein forming said DRAM is done with a plurality of said second type memory blocks and one said first memory block.

11. The method of claim 9, wherein forming said DRAM is done with a plurality of said first type memory blocks.

12. The method of claim 9, wherein selecting said first redundant row is located in said first type memory block separate from said first type memory block containing the failed memory cell.

13. The method of claim 9, wherein selecting said first and second redundant rows in said redundant cell array uses sense amplifiers contained within said first type memory block containing said redundant cell array.

14. The method of claim 9, wherein said method is used for other memory chip technologies configured with a global row redundancy.

15. The method of claim 9, wherein selecting any unused redundant row in any redundant cell array is used to repair said failed memory cell located in any first type memory block and any second type memory block.

* * * * *

UNITED STATES PATENT AND TRADEMARK OFFICE
CERTIFICATE OF CORRECTION

PATENT NO. : 6,101,138
DATED : August 8, 2000
INVENTOR(S) : Chun Shiah et al.

It is certified that error appears in the above-identified patent and that said Letters Patent is hereby corrected as shown below:

<u>Title page,</u>
Item [73], Assignee, delete "Eton Technology, Inc., Hsin-Chu, Taiwan" and replace with -- Etron Technology, Inc., Hsin-Chu, Taiwan --.

Signed and Sealed this

Twenty-fifth Day of April, 2006

JON W. DUDAS
*Director of the United States Patent and Trademark Office*